(12) United States Patent
Lee

(10) Patent No.: US 9,377,799 B2
(45) Date of Patent: Jun. 28, 2016

(54) VOLTAGE GENERATING APPARATUS CAPABLE OF RECOVERING OUTPUT VOLTAGE

(71) Applicant: SK hynix Inc., Gyeonggi-do (KR)

(72) Inventor: Hyun Tae Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 193 days.

(21) Appl. No.: 14/223,588

(22) Filed: Mar. 24, 2014

(65) Prior Publication Data

US 2015/0077077 A1    Mar. 19, 2015

(30) Foreign Application Priority Data

Sep. 13, 2013 (KR) .................. 10-2013-0110536

(51) Int. Cl.
 *G05F 1/56* (2006.01)
 *G11C 5/14* (2006.01)
 *G05F 1/565* (2006.01)

(52) U.S. Cl.
 CPC  *G05F 1/56* (2013.01); *G05F 1/565* (2013.01); *G11C 5/147* (2013.01)

(58) Field of Classification Search
 CPC ........... G05F 1/56; G05F 1/562; G05F 1/565; G05F 1/575
 USPC ........... 323/234, 275, 281, 313; 327/540, 541
 See application file for complete search history.

(56) References Cited

U.S. PATENT DOCUMENTS

| | | | | |
|---|---|---|---|---|
| 4,859,928 A * | 8/1989 | Etheridge | ................ | G05F 3/24 323/311 |
| 5,864,227 A * | 1/1999 | Borden | ................ | G05F 3/247 323/280 |
| 7,071,663 B2 * | 7/2006 | Okubo | ................ | G05F 1/575 323/274 |
| 7,199,565 B1 * | 4/2007 | Demolli | ................ | G05F 1/575 323/273 |
| 7,221,213 B2 * | 5/2007 | Lee | ................ | G05F 1/571 323/280 |
| 2004/0257053 A1 * | 12/2004 | Okubo | ................ | G05F 1/56 323/234 |
| 2006/0139018 A1 * | 6/2006 | Luo | ................ | G05F 1/56 323/282 |
| 2009/0212753 A1 * | 8/2009 | Lou | ................ | G05F 1/563 323/277 |
| 2009/0302812 A1 * | 12/2009 | Shor | ................ | G05F 1/563 323/223 |
| 2010/0253431 A1 * | 10/2010 | Fujiwara | ................ | G05F 1/575 330/253 |
| 2013/0285630 A1 * | 10/2013 | Wang | ................ | G05F 1/10 323/275 |

FOREIGN PATENT DOCUMENTS

| KR | 1020060019164 | 3/2006 |
|---|---|---|
| KR | 1020070038584 | 4/2007 |

* cited by examiner

*Primary Examiner* — Emily P Pham
*Assistant Examiner* — Jye-June Lee
(74) *Attorney, Agent, or Firm* — IP & T Group LLP

(57) ABSTRACT

A voltage generating apparatus according to an embodiment of the present invention includes a voltage regulator determining a pass voltage at a pass node by comparing an output voltage at an output node with a reference voltage, and generating the output voltage by transferring an external power supply voltage to the output node in response to the pass voltage at the pass node, and a voltage stabilizer controlling a first current flowing from the pass node and a second current flowing from the output node in response to the output voltage.

13 Claims, 4 Drawing Sheets

VOLTAGE GENERATING APPARATUS CAPABLE OF RECOVERING OUTPUT VOLTAGE

CROSS-REFERENCE TO RELATED APPLICATION

The present application claims priority on Korean patent application number 10-2013-0110536, filed on Sep. 13, 2013, the entire disclosure of which is incorporated herein in its entirety by reference.

BACKGROUND

1. Field of Invention

Various exemplary embodiments of the present invention relate generally to a voltage generating apparatus, and more particularly, to a constant voltage generating apparatus including a constant voltage stabilizer.

2. Description of Related Art

With the surge in usage of smartphones and tablets, among mobile information devices using semiconductor memory devices as storage media, the semiconductor memory devices have gained increasing interest and importance. The emergence of a wide range of applications as well as a high-speed processor or multi-core parallelism has required increased levels of performance and reliability of semiconductor memory devices.

A semiconductor memory device is a storage device that is realized using a semiconductor made from, for example, silicon (Si germanium (Ge), gallium arsenide (GaAs), or indium phosphide (InP). Semiconductor memory devices are generally classified as volatile memory devices or nonvolatile memory devices. A volatile memory device is unable to retain its stored data when the power is turned off. The volatile memory device includes a static random access memory (SRAM) device, a dynamic RAM (DRAM) device, a synchronous DRAM (SDRAM) device, or the like. A non-volatile memory device may retain its stored data even when powered off. The examples of non-volatile memory device may include a read only memory (ROM) device, a programmable ROM (PROM) device, an erasable programmable ROM (EPROM) device, an electrically erasable programmable ROM (EEPROM) device, a flash memory device, a phase-change RAM (PRAM) device, a magnetic RAM (MRAM) device, a resistive RAM (RRAM) device, a ferroelectric RAM (FRAM) device, or the like. A flash memory device is generally classified as a NOR type or a NAND type.

A semiconductor memory device includes various functional blocks. A constant voltage generating apparatus may be used to supply power to each of the functional blocks. The constant voltage generating apparatus may convert an external power supply voltage into a stabilized power voltage and supply the stabilized power voltage to the various functional blocks, i.e., driving circuits.

SUMMARY

Exemplary embodiments of the present invention are directed to a voltage generating apparatus capable of quickly and stably recovering an output voltage when the output voltage varies due to changes in load current.

A voltage generating apparatus according to an exemplary embodiment of the present invention may include a voltage regulator suitable for determining a pass voltage at a pass node by comparing an output voltage at an output node with a reference voltage and generating the output voltage by transferring an external power supply voltage to the output node in response to the pass voltage at the pass node, and a voltage stabilizer suitable for controlling a first current flowing from the pass node and a second current flowing from the output node in response to the output voltage.

A constant voltage generating apparatus according to another exemplary embodiment of the present invention may include a feedback unit suitable for dividing an output voltage at an output node to generate a feedback, an amplifier suitable for determining a pass voltage at a pass node by comparing the feedback voltage with a reference voltage, a voltage pass unit suitable for transferring an external power supply voltage to the output node in response to the pass voltage at the pass node, and a voltage stabilizer suitable for increasing a first current flowing from the pass node when the output voltage at the output node drops lower than a target level and increasing a second current flowing from the output node when the output voltage at the output node rises higher than a target level.

DETAILED DESCRIPTION

Hereinafter, various exemplary embodiments of the present invention will be described in detail with reference to the accompanying drawings. The figures are provided to enable those of ordinary skill in the art to make and use the present invention according to the exemplary embodiments of the present invention.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

It should be readily understood that the meaning of and "over in the present disclosure should be interpreted in the broadest manner such that "on" means not only "directly on" but also on" something with an intermediate feature(s) or a layer(s) therebetween, and that "over" means not only directly on top but also on top of something with an intermediate feature(s) or a layer(s) therebetween.

Figure 1:
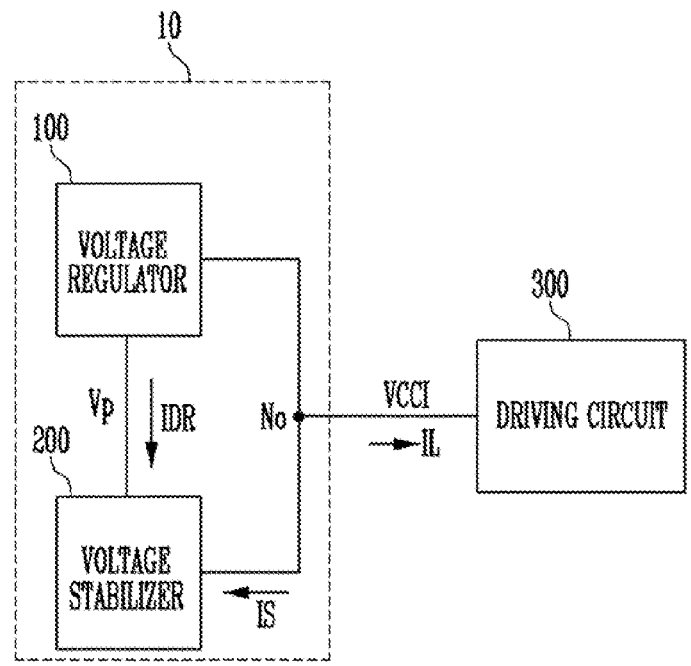
FIG. 1 is block diagram of a constant voltage generating apparatus and a driving circuit coupled thereto according to an embodiment of the present invention.

FIG. 1 is a block diagram of a constant voltage generating apparatus and a driving circuit coupled thereto according to an embodiment of the present invention.

Referring to FIG. 1, a constant voltage generating apparatus 10 may include a voltage regulator 100 and a voltage stabilizer 200. The constant voltage generating apparatus 10 may be coupled to a driving circuit 300. The constant voltage generating apparatus 10 may transfer an output voltage VCCI to the driving circuit 300. A load current IL may flow from the constant voltage generating apparatus 10 to the driving circuit 300 depending on an impedance of the driving circuit 300.

The voltage regulator 100 may generate the output voltage VCCI. The voltage regulator 100 may determine a voltage Vp at a pass node Np by comparing a reference voltage with a feedback voltage based on the output voltage VCCI, which is a voltage at an output node No, and it may generate the output voltage VCCI by transferring an external power supply voltage to the output node No in response to the voltage Vp at the pass node Np. Operations of the voltage regulator 100 will be described below in detail with reference to FIGS. 2 and 3.

The voltage stabilizer 200 may be coupled to the voltage regulator 100. More specifically, the voltage stabilizer 200 may be coupled to the pass node Np of the voltage regulator 100. On the basis of the output voltage VCCI of the voltage regulator 100, the voltage stabilizer 200 may control a current IDR at the pass node Np of the voltage regulator 100 and a stabilizing current IS flowing from the output node No of the voltage regulator 100 to the voltage stabilizer 200.

The voltage stabilizer 200 may control the current IDR at the pass node Np of the voltage regulator 100. When the output voltage VCCI at the output node No is reduced by changes in the load current IL flowing into the driving circuit 300, the voltage stabilizer 200 may generate the current IDR at the pass node Np of the voltage regulator 100 on the basis of the output voltage VCCI. Therefore, since the voltage Vp at the pass node Np of the voltage regulator 100 is more quickly reduced, the external power supply voltage may be quickly transferred to the output node No, so that the output voltage VCCI may quickly increase. As a result, the output voltage VCCI may be stably recovered to obtain a target voltage level.

When the output voltage VCCI at the output node No is increased by changes in the load current IL flowing into the driving circuit 300, the voltage stabilizer 200 may generate the stabilizing current IS at the output node No of the voltage regulator 100 on the basis of the output voltage VCCI. Therefore, since the output voltage VCCI at the output node No of the voltage regulator 100 is more quickly reduced, the output voltage VCCI may be stably recovered to reach the target voltage level. Operations of the voltage stabilizer 200 will be described below with reference to FIGS. 4 to 8.

Figure 2:
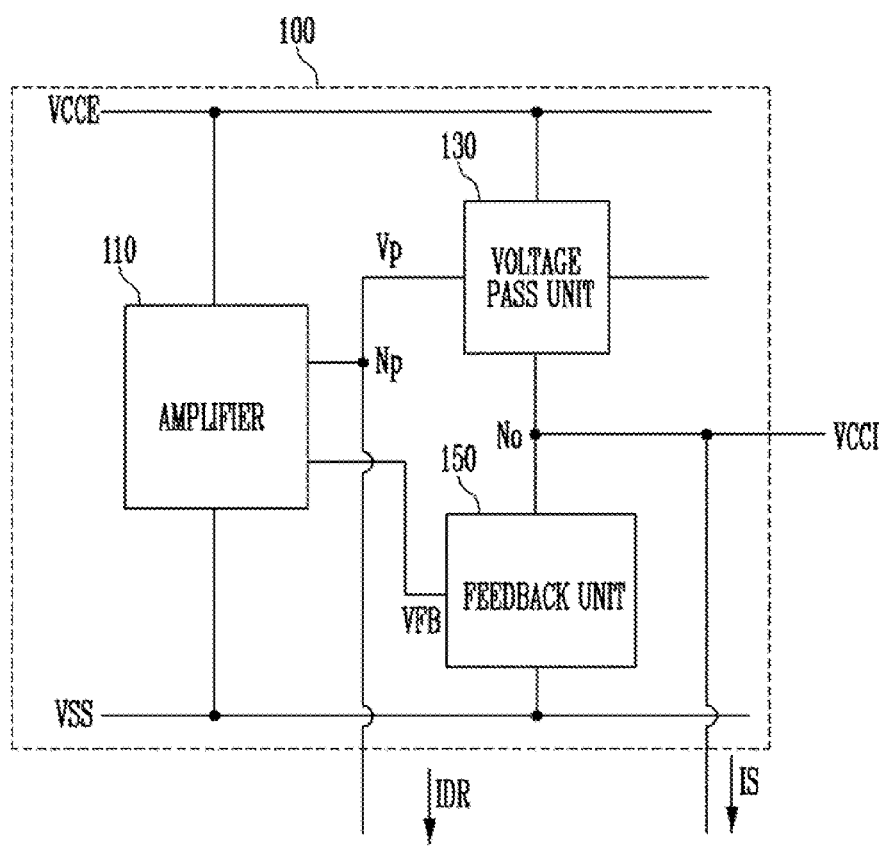
FIG. 2 is a block diagram of a voltage regulator according to an embodiment of the present invention.

FIG. 2 is a block diagram of a voltage regulator according to an embodiment of the present invention.

Referring to FIG. 2, the voltage regulator 100 may include an amplifier 110, a voltage pass unit 130, and a feedback unit 150. The amplifier 110 may be coupled to the external power supply voltage VCCE and a ground voltage VSS. The voltage pass unit 130 may be coupled between the external power voltage VCCE and the output node No. The feedback unit 150 may be coupled between the output node No and the ground voltage VSS.

The amplifier 110 may receive a feedback voltage VFB from the feedback unit 150. The amplifier 110 may determine the voltage Vp at the pass node Np by comparing the feedback voltage VFB with the reference voltage. For example, according to an embodiment of the present invention, when the feedback voltage VFB is greater than the reference voltage, a logic-high voltage may be transferred to the pass node Np. Alternatively, when the feedback voltage VFB is less than the reference voltage, a logic-low voltage may be transferred to the pass node Np. According to another embodiment, when the feedback voltage VFB is greater than the reference voltage, the logic-low voltage may be transferred to the pass node Np. Alternatively, when the feedback voltage VFB is less than the reference voltage, the logic-high voltage may be transferred to the pass node Np. As described above, the voltage Vp at the pass node Np that is determined by comparing the feedback voltage VFB with the reference voltage may vary depending on the embodiments.

The voltage pass unit 130 may transfer the external power supply voltage VCCE to the output node No on the basis of the voltage Vp at the pass node Np. In other words, the voltage pass unit 130 may determine whether to transfer the external power supply voltage VCCE to the output node No based on a result of comparing the reference voltage with the feedback voltage VFB generated from the feedback unit 150.

According to an embodiment, when the voltage Vp at the pass node Np is a logic-high voltage since the feedback voltage VFB is greater than the reference voltage, the voltage pass unit 130 may not transfer the external power supply voltage VCCE to the output node No. In addition, when the voltage Vp at the pass node Np is a logic-low voltage since the feedback voltage VFB is less than the reference voltage, the voltage pass unit 130 may transfer the external power supply voltage VCCE to the output node No to increase the output voltage VCCI at the output node No. According to another embodiment, when the voltage Vp at the pass node Np is a logic-low voltage since the feedback voltage VFB is greater than the reference voltage, the voltage pass unit 130 may not transfer the external power supply voltage VCCE to the output node No. In addition, when the voltage Vp at the pass node Np is a logic-high voltage since the feedback voltage VFB is less than the reference voltage, the voltage pass unit 130 may transfer the external power supply voltage VCCE to the output node No to increase the output voltage VCCI at the output node No.

According to embodiments of the present invention, when the feedback voltage VFB is greater than the reference voltage, the voltage pass unit 130 may not transfer the external power supply voltage VCCE to the output node No. In addition, when the feedback voltage VFB is less than the reference voltage, the voltage pass unit 130 may transfer the external power supply voltage VCCE to the output node No. As a result, the voltage regulator 100 may maintain and stabilize the output voltage VCCI fluctuating at the output node No.

In the constant voltage generating apparatus according to an embodiment of the present invention, when the output voltage VCCI at the output node No is reduced by changes in the load current flowing into the driving circuit, the voltage stabilizer 200 may generate the current IDR at the pass node Np. In this embodiment of the present invention, the voltage Vp at the pass node Np may more quickly change from the logic-high voltage to the logic-low voltage due to the current IDR flowing from the pass node Np to the voltage stabilizer 200. As a result, the output voltage VCCI at the output node No may be more quickly increased and stably recovered to obtain a target voltage level.

In the constant voltage generating apparatus according to an embodiment of the present invention, when the output voltage VCCI at the output node No is increased by changes in the load current flowing into the driving circuit, the voltage stabilizer 200 may generate the stabilizing current IS at the output node No. As a result, the voltage VCCI at the output node No may be more quickly reduced by the stabilizing current IS flowing from the output node No to the voltage stabilizer 200, so that the voltage VCCI may be stably recovered to reach a target voltage level.

The feedback unit 150 may divide the output voltage VCCI at the output node No to generate the feedback voltage VFB. According to an embodiment, the feedback unit 150 may divide the output voltage VCCI and transfer a voltage that is smaller than the output voltage VCCI as the feedback voltage VFB to the amplifier 110. According to an embodiment, the feedback unit 150 may transfer the same voltage as the output voltage VCCI as the feedback voltage VFB to the amplifier 110.

The configuration and operations of the voltage regulator that includes the amplifier 110, the voltage pass unit 130, and the feedback unit 150 will be described below with reference to FIG. 3.

Figure 3:
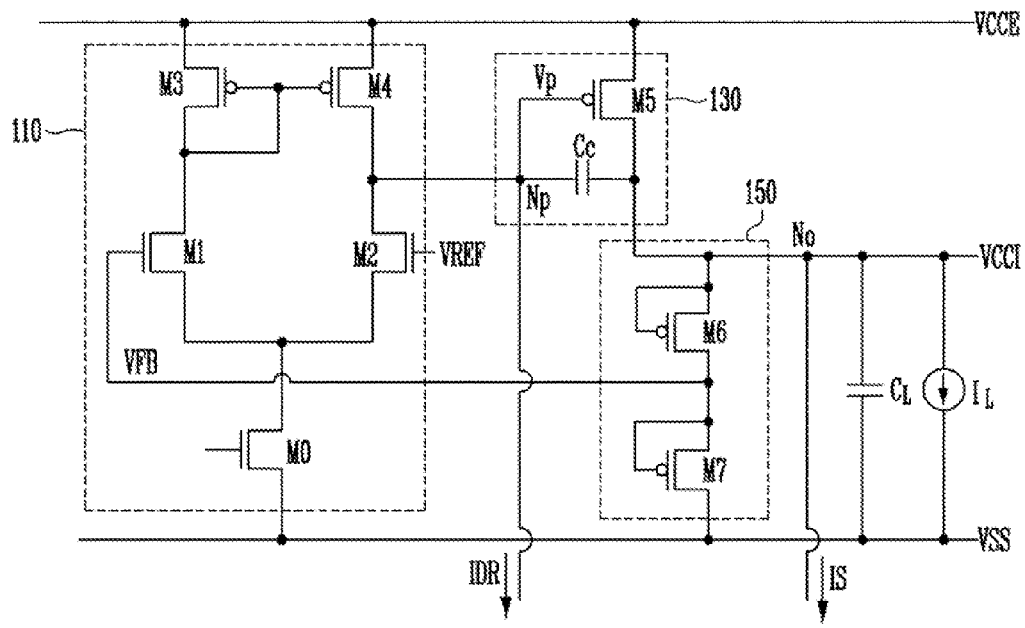
FIG. 3 is a detailed circuit diagram of a voltage regulator according to an embodiment of the present invention.

FIG. 3 is a detailed circuit diagram of a voltage regulator according to an embodiment of the present invention.

FIG. 3 illustrates a circuit diagram of the amplifier 110, the voltage pass unit 130, and the feedback unit 150. In addition, a load capacitor CL and a load current IL that are generated by a load, which is coupled to the output node No, are also illustrated.

The amplifier 110 may include an amplifier driving transistor M0, a first PMOS transistor M3, a second PMOS transistor M4, a first NMOS transistor M1, and a second NMOS transistor M2. The first PMOS transistor M3 and the second PMOS transistor M4 may have sources coupled to the external power supply voltage VCCE, and gates of the first PMOS transistor M3 and the second PMOS transistor M4 may be coupled to each other. A drain of the first NMOS transistor M1 may be coupled to a drain of the first PMOS transistor M3, and a drain of the second NMOS transistor M2 may be coupled to a drain of the second PMOS transistor M4. The first NMOS transistor M1 may receive the feedback voltage VFB through a gate thereof, and the second NMOS transistor M3 may receive a reference voltage VREF through a gate thereof. Sources of the first NMOS transistor M1 and the second NMOS transistor M3 may be coupled to a drain of the amplifier driving transistor M0. A source of the amplifier driving transistor M0 may be coupled to the ground voltage VSS.

The amplifier 110 may determine the voltage Vp at the pass node Np by comparing the feedback voltage VFB, which is inputted to the first NMOS transistor, with the reference voltage VREF, which is inputted to the second NMOS transistor. According to an embodiment, when the feedback voltage VFB is greater than the reference voltage VREF, the voltage Vp at the pass node Np, which is outputted from the amplifier 110, may have a relatively high logic-level voltage. On the other hand, when the feedback voltage VFB is less than the reference voltage VREF, the voltage Vp at the pass node Np, which is outputted from the amplifier 110, may have a relatively low logic-level voltage. Operations of the voltage pass unit 130 may be determined depending on whether the voltage Vp at the pass node Np is a logic-high voltage or a logic-low voltage.

The voltage pass unit 130 may include a pass transistor M5 and a capacitor Cc. According to an embodiment, the pass transistor M5 may be a PMOS transistor. A source of the pass transistor M5 may be coupled to the external power supply voltage VCCE, a gate thereof may be coupled to the pass node Np, and a drain thereof may be coupled to the output node No.

When a logic-high voltage is applied to the gate of the pass transistor M5, the pass transistor M5 may be turned off, and thus the external power supply voltage VCCE may not be transferred to the output node No. When a logic-low voltage is applied to the gate of the pass transistor M5, the pass transistor M5 may be turned on, and thus the external power supply voltage VCCE may be transferred to the output node No. Therefore, when the output voltage VCCI at the output node No is temporarily reduced, the feedback voltage VFB may drop so that the amplifier 110 may output the logic-low voltage to the pass node Np. Therefore, the pass transistor M5 may be turned on to transfer the external power supply voltage VCCE to the output node No, so that the output voltage VCCI may be recovered.

The amount of time it takes for the temporarily dropped output voltage VCCI to be recovered to obtain a target voltage level through the above-described processes may be related to an operating time of the pass transistor M5. In order for the pass transistor M5 to quickly change from a turn-off state to a turn-on state, the voltage Vp at the pass node Np may quickly decrease from the logic-high voltage to the logic-low voltage in response to the drop of the output voltage VCCI. To this end, a current flowing out of the pass node Np may be increased. Since the voltage stabilizer 200 generates the current IDR, flowing from the pass node Np, when the output voltage VCCI drops, the constant voltage generating apparatus according to the present invention may be more quickly recovered to obtain a target voltage level of the output voltage VCCI.

The feedback unit 150 may include a first division PMOS transistor M6 and a second division PMOS transistor M7. A source and a gate of the first division PMOS transistor M6 may be coupled to the output node No. A source and a gate of the second division PMOS transistor M7 may be coupled to a drain of the first division PMOS transistor M6. A drain of the second division PMOS transistor M7 may be coupled to the ground voltage VSS. The feedback unit 150 may transfer a drain voltage of the first division PMOS transistor M6 as the feedback voltage VFB to the amplifier 110.

When the output voltage VCCI at the output node No temporarily increases, since the pass transistor M5 of the voltage pass unit 130 is turned off as described above, the external power supply voltage VCCE may not be transferred to the output node No. Since a current flows through the first division PMOS transistor M6 and the second division PMOS transistor M7 of the feedback unit 150, a voltage between both ends of the load capacitor CL may drop with time, so that the output voltage VCCI may be recovered to obtain a target level at last.

The amount of time it takes for the temporarily increasing output voltage VCCI to recover may be related to the amount of current flowing out of the output node No. In order for the output voltage VCCI to drop quickly, the amount of current flowing out of the output node No may be increased. Since the voltage stabilizer 200 of the constant voltage generating apparatus according to the present invention generates the stabilizing current IS, flowing from the output node No, when the output voltage VCCI increases, the output voltage VCCI may be recovered to obtain a target level by being more quickly reduced.

Figure 4:
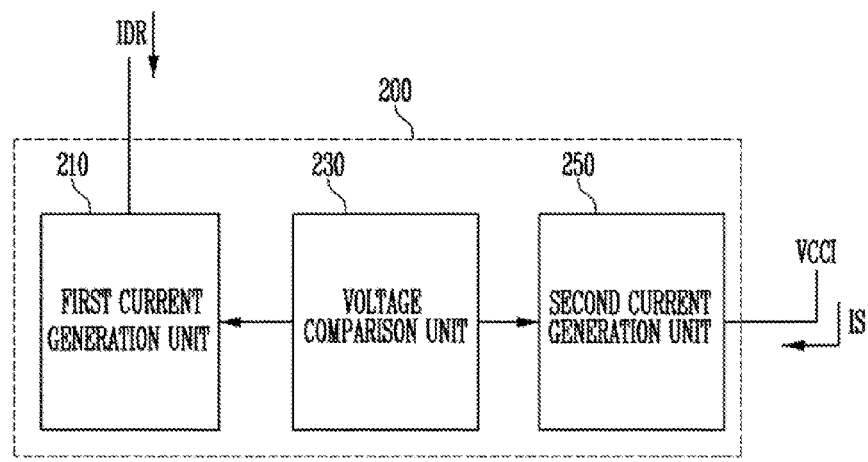
FIG. 4 is a block diagram of a voltage stabilizer according to an embodiment of the present invention.

FIG. 4 is a block diagram of a voltage stabilizer according to an embodiment of the present invention.

Referring to FIG. 4, a voltage stabilizer 200 may include a first current generation unit 210, a voltage comparison unit 230, and a second current generation unit 250.

The voltage comparison unit 230 may generate a first comparison signal and a second comparison signal by comparing the output voltage VCCI at the output node No with a comparison voltage. The first current generation unit 210 may be coupled to the pass node Np of the voltage regulator 100. The first current generation unit 210 may control the current IDR at the pass node Np of the voltage regulator 100 in response to the first comparison signal. The second current generation unit 250 may be coupled to the output node No of the voltage regulator 100. The second current generation unit 250 may control the stabilizing current IS at the output node No of the voltage regulator 100 in response to the second comparison signal.

The voltage comparison unit 230 may determine whether the current output voltage VCCI is higher than a target voltage level by comparing the output voltage VCCI at the output node No with the comparison voltage. According to an embodiment, the comparison voltage of the voltage comparison unit 230 may be equal to the reference voltage (VREF) which is inputted to the amplifier 110 of the voltage regulator 100. According to another embodiment, a different voltage from the reference voltage (VREF), which is inputted to the amplifier 110 of the voltage regulator 100, may serve as the comparison voltage of the voltage comparison unit 230.

In response to the output voltage VCCI at the output node No, the voltage stabilizer 200 may generate the current IDR at the pass node Np of the voltage regulator 100 through the first current generation unit 210 or generate the stabilizing current IS flowing from the output node No of the voltage regulator 100 through the second current generation unit 250.

When the output voltage VCCI at the output node No is lower than the target voltage level, the voltage comparison unit 230 may transfer the activated first comparison signal to the first current generation unit 210 in order to increase the output voltage VCCI. The first current generation unit 210 may generate the current IDR, flowing from the pass node Np of the voltage regulator 100, in response to the first comparison signal.

The first current generation unit 210 may generate the current IDR flowing from the pass node Np in response to a result of comparison from the voltage comparison unit 230. When the output voltage VCCI at the output node No is lower than the target voltage level, the voltage comparison unit 230 may generate a signal for turning on the first current generation unit 210. In response to the signal, the first current generation unit 210 may generate the current IDR flowing from the pass node Np. As described above with reference to FIG. 3, when the amount of current flowing out of the pass node Np of the voltage regulator 100 increases the pass transistor M5 may be quickly turned on, so that the external power supply voltage VCCE may be transferred to the output node No. As a result, the time it takes for the output voltage VCCI to recover may be reduced.

When the output voltage VCCI at the output node No is higher than the target voltage level, the voltage comparison unit 230 may transfer the activated second comparison signal to the second current generation unit 250 in order to reduce the output voltage VCCI at the output node No. The second current generation unit 250 may generate the stabilizing current IS flowing from the output node No of the voltage regulator 100 in response to the second comparison signal.

The second current generation unit 250 may generate the stabilizing current IS, flowing through the output node No, in response to a result of comparison from the voltage comparison unit 230. When the output voltage VCCI at the output node No is higher than the target voltage level, the voltage comparison unit 230 may generate a signal for turning on the second current generation unit 250. In response to the signal, the second current generation unit 250 may generate the stabilizing current IS flowing from the output node No. As described above with reference to FIG. 3, when the amount of current flowing out of the output node No of the voltage regulator 100 increases, a voltage between both ends of the load capacitor Cc may quickly decrease, so that the time it takes for the output voltage VCCI to recover may be reduced.

Figure 5:
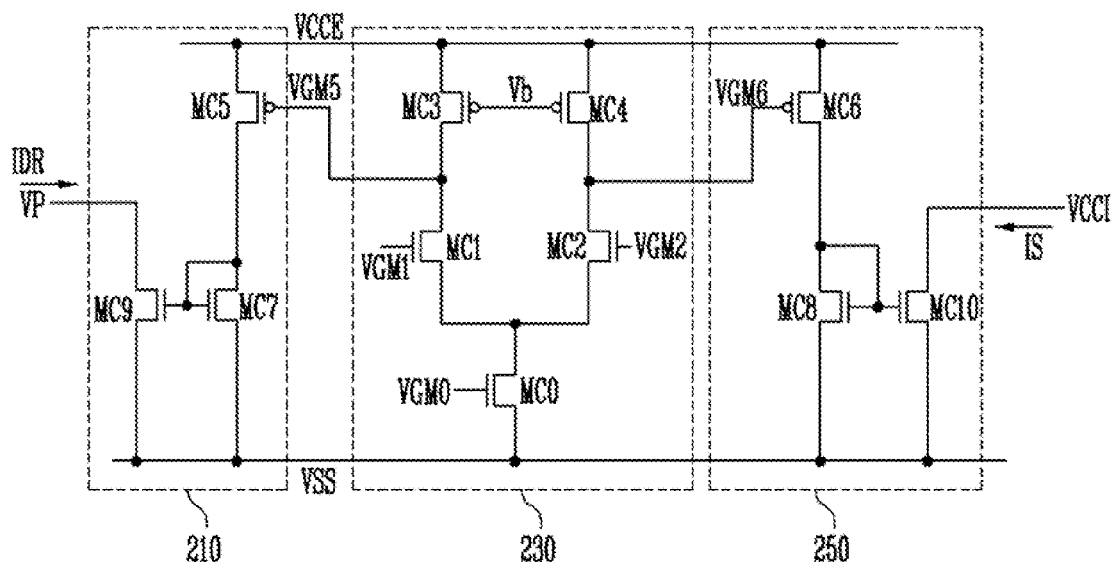
FIG. 5 is a detailed circuit diagram of a voltage stabilizer according to an embodiment of the present invention.

FIG. 5 is a detailed circuit diagram of a voltage stabilizer according to an embodiment of the present invention.

Referring to FIG. 5, the voltage comparison unit 230 may include a first comparison transistor MC1, a second comparison transistor MC2, a third comparison transistor MC3, fourth comparison transistor MC4, and a driving transistor MC0. The first comparison transistor MC1, the second comparison transistor MC2 and the driving transistor MC0 may be NMOS transistors. Sources of the first comparison transistor MC1 and the second comparison transistor MC2 may be coupled to a drain of the driving transistor MC0. The output voltage VCCI at the output node No may be applied as a gate voltage VGM2 of the second comparison transistor MC2. The comparison voltage may be applied as a gate voltage VGM1 of the first comparison transistor MC1. The third comparison transistor MC3 and the fourth comparison transistor MC4 may be PMOS transistors. Sources of the third comparison transistor MC3 and the fourth comparison transistor MC4 may be coupled to the external power supply voltage VCCE. A drain of the third comparison transistor MC3 may be coupled to a drain of the first comparison transistor MC1. A drain of the fourth comparison transistor MC4 may be coupled to a drain of the second comparison transistor MC2. A drain voltage of the first comparison transistor MC1 may be transferred as a first comparison signal VGM5 to the first current generation unit 210. A drain voltage of the second comparison transistor MC2 may be transferred as a second comparison signal VGM6 to the second current generation unit 250.

When a value of the output voltage VCCI is in a target level, a value of the gate voltage VGM2 of the second comparison transistor MC2 may be equal to that of the gate voltage VGM1 of the first comparison transistor MC1. In other words, a value of the comparison voltage, which is applied as the gate voltage VGM1 of the first comparison transistor MC1, may be determined to correspond to a target voltage value of the output voltage VCCI. When the value of the output voltage VCCI at the output node No, which is applied as the gate voltage VGM2 of the second comparison transistor MC2, is equal to that of the comparison voltage, which is applied as the gate voltage VGM1 of the first comparison transistor MC1, the third comparison transistor MC3 and the fourth comparison transistor MC4 may be biased to operate in a linear region. Drain voltages of the third comparison transistor MC3 and the fourth comparison transistor MC4, i.e., the first comparison signal VGM5 and the second comparison signal VGM6 may have values close to the external power supply voltage VCCE. Therefore, the first comparison signal VGM5 and the second comparison signal VGM6 may have logic-high voltage values. As described below, when the first comparison signal VGM5 and the second comparison signal VGM6 have the logic-high voltage values, the first current generation unit 210 and the second current generation unit 250 may be turned off.

When the value of the output voltage VCCI at the output node No is lower than that of the comparison voltage, which is applied as the gate voltage VGM1 of the first comparison transistor MC1 the first comparison transistor MC1 may be turned on, and the second comparison transistor MC2 may be turned off. Thus, the amount of current flowing through the third comparison transistor MC3 may increase, so that the voltage value indicating the first comparison signal VGM5 may decrease. Therefore, the first comparison signal VGM5 may have a logic-low voltage value, and the second comparison signal VGM6 may have a logic-high voltage value.

As described below, when the first comparison signal VGM5 has the logic-low voltage value and the second comparison signal VGM6 has the logic-high voltage value, the first current generation unit 210 may be turned on, and the second current generation unit 250 may be turned off. Since the first current generation unit 210 is turned on, the current IDR flowing from the pass node Np may be generated. Therefore, since the current IDR flowing from the pass node Np of the voltage regulator 100 increases, the pass transistor M5 may be quickly turned on, and the external power supply voltage VCCE may be transferred to the output node No, so that the time it takes for the output voltage VCCI to recover may be reduced.

When the value of the output voltage VCCI at the output node No, which is applied as the gate voltage VGM2 of the second comparison transistor MC2, is greater than that of the comparison voltage, which is applied as the gate voltage VGM1 of the first comparison transistor MC1, the first comparison transistor MC1 may be turned off, and the second comparison transistor MC2 may be turned on. Thus, the amount of current flowing through the fourth comparison transistor MC4 may increase, and the voltage value indicating the second comparison signal VGM6 may decrease. Therefore, the first comparison signal VGM5 may have a logic-high voltage value, and the second comparison signal VGM6 may have a logic-low voltage value.

As described below, when the first comparison signal VGM5 has the logic-high voltage value and the second comparison signal VGM6 has the logic-low voltage value, the first current generation unit 210 may be turned off, and the second current generation unit 250 may be turned on. Since the second current generation unit 250 is turned on, the stabilizing current IS flowing from the output node No may be generated. Therefore, the amount of current flowing from the load capacitor Cc may increase, and a voltage between both ends of the load capacitor Cc may quickly decrease, so that the time it takes for the output voltage VCCI to recover may be reduced.

The first current generation unit 210 may include a fifth comparison transistor MC5 and a first current mirror circuit. The first current mirror circuit may include two NMOS transistors MC7 and MC9. The fifth comparison transistor MC5 may be a PMOS transistor. A source of the fifth comparison transistor MC5 may be coupled to the external power supply voltage VCCE. A gate of the fifth comparison transistor MC5 may receive the first comparison signal VGM5. A drain of the fifth comparison transistor MC5 may be coupled to the first current mirror circuit. The first current mirror circuit may be coupled between the fifth comparison transistor MC5 and the pass node Np of the voltage regulator 100.

When the first comparison signal VGM5, applied to the gate of the fifth comparison transistor MC5, is the logic-high voltage value, the fifth comparison transistor MC5 may be turned off and the current may not flow. Therefore, the current may not flow through the first current mirror circuit, and the current IDR flowing from the pass node Np may become zero.

When the first comparison signal VGM5, applied to the gate of the fifth comparison transistor MC5, is the logic-low voltage value, the fifth comparison transistor MC5 may be turned on, and the current may flow. Therefore, a current may flow through the first current mirror circuit, and the current IDR flowing from the pass node Np may not be zero but become a value of current flowing through the fifth comparison transistor MC5.

When the value of the output voltage VCCI at the output node No is reduced, the voltage comparison unit 230 may change the first comparison signal VGM5 from the logic-high voltage value to the logic-low voltage value, so that the fifth comparison transistor MC5 of the first current generation unit 210 may be turned on. Therefore, since the first current mirror circuit of the first current generation unit 210 may generate the current IDR flowing from the pass node Np, the pass transistor M5 may be quickly turned on, so that the time it takes for the output voltage VCCI to recover may be reduced.

The second current generation unit 250 may include a sixth comparison transistor MC6 and a second current mirror circuit. The second current mirror circuit may include two NMOS transistors MC8 and MC10. The sixth comparison transistor MC6 may be a PMOS transistor. A source of the sixth comparison transistor MC6 may be coupled to the external power supply voltage VCCE. A gate of the sixth comparison transistor MC6 may receive the second comparison signal VGM6. A drain of the sixth comparison transistor MC6 may be coupled to the second current mirror circuit. The second current mirror circuit may be coupled between the sixth comparison transistor MC6 and the output node No of the voltage regulator 100.

When the second comparison signal VGM6, applied to the gate of the sixth comparison transistor MC6, is the logic-high voltage value, the sixth comparison transistor MC6 may be turned off, and the current may not flow. Therefore, a current may not flow through the second current mirror circuit, and the stabilizing current IS, flowing from the output node No, may become zero.

When the second comparison signal VGM6, applied to the gate of the sixth comparison transistor MC6, is the logic-low voltage value, the sixth comparison transistor MC6 may be turned on, and the current may flow. Therefore, the current may flow through the second current mirror circuit, and the stabilizing current IS flowing from the output node No may not be zero but become a value of current flowing through the sixth comparison transistor MC6.

When the value of the output voltage VCCI at the output node No increases, the voltage comparison unit 230 may turn on the sixth comparison transistor MC6 of the second current generation unit 250 by changing the second comparison signal VGM6 from the logic-high voltage value to the logic-low voltage value. Therefore, since the second current mirror circuit of the second current generation unit 250 generates the stabilizing current IS flowing from the output node No, a voltage between both ends of the load capacitor Cc may quickly drop, so that the time it takes for the output voltage VCCI to recover may be reduced.

Figure 6:
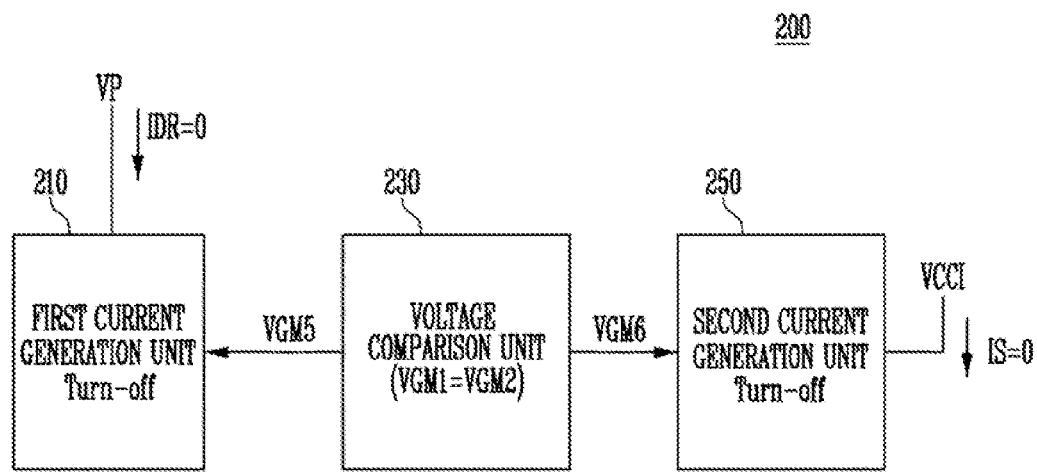
FIGS. 6 to 8 are views illustrating operations of a voltage stabilizer according to an embodiment of the present invention.
Figure 7:
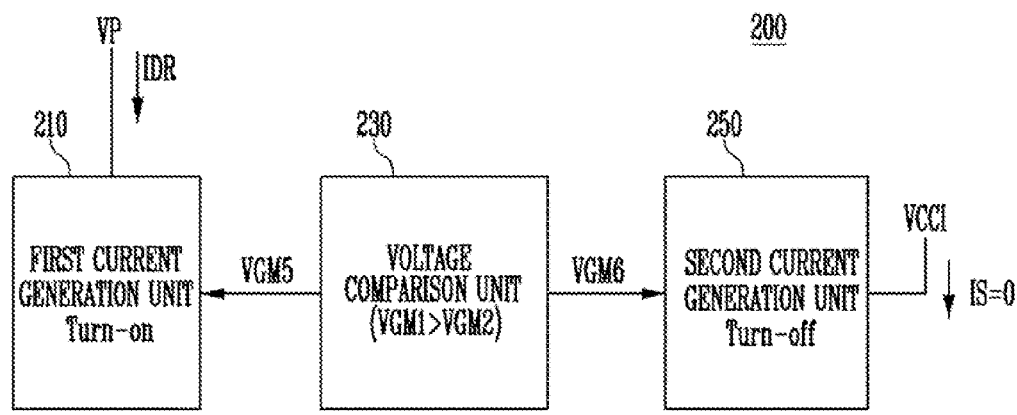
Figure 8:
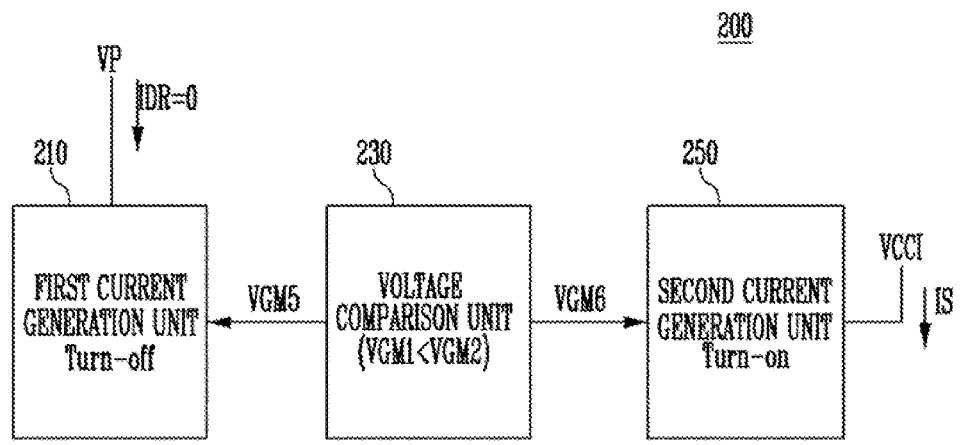

FIGS. 6 to 8 are views illustrating operations of a voltage stabilizer according to an embodiment of the present invention.

FIG. 6 is a view illustrating operations of a voltage stabilizer when the output voltage VCCI is stabilized, i.e., when the output voltage VCCI is maintained at a target voltage value and the gate voltage VGM1 of the first comparison transistor MC1 and the gate voltage VGM2 of the second comparison transistor MC2 are equal to each other. When the gate voltage VGM1 of the first comparison transistor MC1 is equal to the gate voltage VGM2 of the second comparison transistor MC2, as described above with reference to FIG. 5, both the first comparison signal VGM5 and the second comparison signal VGM6 may have the logic-high voltage values. Therefore, since both the fifth comparison transistor MC5 of the first current generation unit 210 and the sixth comparison transistor MC6 of the second current generation unit 250 are turned off, both the current IDR, flowing from the pass node Np to the first current generation unit 210, and the stabilizing current IS, flowing from the output node No to the second current generation unit 250, may become zero.

FIG. 7 is a view illustrating operations of the voltage stabilizer when the gate voltage VGM1 of the first comparison transistor MC1 is greater than the gate voltage VGM2 of the second comparison transistor MC2 while the output voltage VCCI is reduced. When the gate voltage VGM1 of the first comparison transistor MC1, which is the comparison voltage, is greater than the gate voltage VGM2 of the second comparison transistor MC2, which is the output voltage VCCI, as described above with reference to FIG. 5, the first comparison signal VGM5 may have the logic-low voltage value, and the second comparison signal VGM6 may have the logic-high voltage value. Thus, the fifth comparison transistor MC5 of the first current generation unit 210 may be turned on, so that the current IDR flowing from the pass node Np to the first current generation unit 210 may be generated. In addition, since the sixth comparison transistor MC6 of the second current generation unit 250 is turned off, the stabilizing current IS, flowing from the output node No to the second current generation unit 250, may become zero. Therefore, since the pass transistor M5 is quickly turned on, the time it takes for the output voltage VCCI to recover may be reduced.

FIG. 8 is a view illustrating operations of the voltage stabilizer when the gate voltage VGM1 of the first comparison transistor MC1 is less than the gate voltage VGM2 of the second comparison transistor MC2 while the output voltage VCCI is increased. When the gate voltage VGM1 of the first comparison transistor MC1, which is the comparison voltage, is less than the gate voltage VGM2 of the second comparison transistor MC2, which is the output voltage VCCI, as described above with reference to FIG. 5, the first comparison signal VGM5 may have the logic-high voltage value, and the second comparison signal VGM6 may have the logic-low voltage value. Thus, the fifth comparison transistor MC5 of the first current generation unit 210 may be turned off, so that the current IDR flowing from the pass node Np to the first current generation unit 210 may become Zero. In addition, since the sixth comparison transistor MC6 of the second current generation unit 250 is turned on, the stabilizing current IS flowing from the output node No to the second current generation unit 250 may be generated. Therefore, since a voltage between both ends of the load capacitor Cc quickly drop, the time it takes for the output voltage VCCI to recover may be reduced.

According to embodiments of the present invention, when an output voltage of a voltage regulator drops or rises, a voltage stabilizer may generate a current flowing from a pass node or an output node of the voltage regulator. Therefore, the output voltage may be quickly recovered to reach a voltage level in a normal state. As a result, operating properties of a semiconductor device may be improved.

According to embodiments of the present invention, a constant voltage generation apparatus may quickly and stably recover an output voltage when the output voltage varies due to changes in load current.

While the present invention has been described with respect to the specific embodiments, it will be apparent to those skilled in the art that various changes and modifications may be made without departing from the spirit and scope of the invention as defined in the following claims.

What is claimed is:

1. A voltage generating apparatus, comprising:
a voltage regulator suitable for determining a pass voltage at a pass node by comparing a feedback voltage based on an output voltage at an output node with a reference voltage, and generating the output voltage by transferring an external power supply voltage to the output node in response to the pass voltage at the pass node; and
a voltage stabilizer suitable for controlling a first current flowing from the pass node and a second current flowing from the output node in response to the output voltage,
wherein the voltage stabilizer comprises:
a voltage comparison unit suitable for generating a first comparison signal and a second comparison signal by comparing the output voltage at the output node with the reference voltage;
a first current generation unit suitable for controlling the first current in response to the first comparison signal; and
a second current generation unit suitable for controlling the second current in response to the second comparison signal, and
wherein the voltage comparison unit comprises;
a first comparison transistor suitable for receiving the output voltage at the output node through a gate thereof;
a second comparison transistor suitable for receiving the reference voltage through a gate thereof;
a third comparison transistor having a source coupled to a node of the external power supply voltage and a drain coupled to the first comparison transistor;
a fourth comparison transistor having a source coupled to the node of the external power supply voltage and a drain coupled to the second comparison transistor; and
a driving transistor having a drain coupled to a source of the first comparison transistor and a source of the second comparison transistor,
wherein the first comparison transistor and the second comparison transistor are NMOS transistors, the third comparison transistor and the fourth comparison transistor are PMOS transistors, and a gate of the third comparison transistor is coupled to a gate of the fourth comparison transistor.

2. The voltage generating apparatus of claim 1, wherein the voltage regulator comprises:
a feedback unit suitable for generating the feedback voltage by dividing the output voltage;
an amplifier suitable for determining the pass voltage at the pass node by comparing the feedback voltage with the reference voltage; and
a voltage pass unit suitable for generating the output voltage by transferring the external power supply voltage to the output node based on the pass voltage at the pass node.

3. The voltage generating apparatus of claim 2, wherein the amplifier compares the feedback voltage with the reference voltage, transfers a logic-high voltage to the pass node as a result of comparison when the feedback voltage is higher than the reference voltage, and transfers a logic-low voltage to the pass node as the result of the comparison when the feedback voltage is lower than the reference voltage.

4. The voltage generating apparatus of claim 3, wherein the pass transistor is turned off when the pass voltage at the pass node is the logic-high voltage, and the pass transistor is turned on to transfer the external power supply voltage when the pass voltage at the pass node is the logic-low voltage.

5. The voltage generating apparatus of claim 4, wherein the voltage pass unit comprises:
a PMOS transistor having a gate coupled to the pass node, a source coupled to a node of the external power supply voltage and a drain coupled to the output node; and
a capacitor coupled between the gate and the drain of the PMOS transistor.

6. The voltage generating apparatus of claim 2, wherein the feedback unit includes:
a first division PMOS transistor having a source and a gate, coupled to the output node; and a second division PMOS transistor having a source and a gate, coupled to a drain of the first division PMOS transistor, wherein, the feedback unit transfers a drain voltage of the first division PMOS transistor as the feedback voltage to the amplifier.

7. The voltage generating apparatus of claim 1, wherein the first comparison signal is a drain voltage of the third comparison transistor, and the second comparison signal is a drain voltage of the fourth comparison transistor.

8. The voltage generating apparatus of claim 1, wherein the first current generation unit comprises:
 a fifth comparison transistor turned on/off in response to the first comparison signal; and
 a first current mirror circuit suitable for increasing the first current when the fifth comparison transistor is turned on.

9. The voltage generating apparatus of claim 8, wherein the fifth comparison transistor is a PMOS transistor,
 the fifth comparison transistor has a gate for receiving the first comparison signal and a source for receiving the external power voltage, and
 the first current mirror circuit is coupled between a drain of the fifth comparison transistor and the pass node.

10. The voltage generating apparatus of claim 1, wherein the second current generation unit comprises:
 a sixth comparison transistor turned on, off in response to the second comparison signal; and
 a second current mirror circuit suitable for increasing the second current when the sixth comparison transistor is turned on.

11. The voltage generating apparatus of claim 10, wherein the sixth comparison transistor is a PMOS transistor,
 the sixth comparison transistor has a gate for receiving the second comparison signal and a source for receiving the external power voltage, and
 the second current mirror circuit is coupled between a drain of the sixth comparison transistor and the output.

12. A constant voltage generating apparatus, comprising:
 a feedback unit suitable for dividing an output voltage at an output node to generate a feedback voltage;
 an amplifier suitable for determining a pass voltage at a pass node by comparing the feedback voltage with a reference voltage;
 a voltage pass unit suitable for transferring an external power supply voltage to the output node in response to the pass voltage at the pass node; and
 a voltage stabilizer suitable for increasing a first current flowing from the pass node when the output voltage at the output node drops to a value lower than a target level and increasing a second current flowing from the output node when the output voltage at the output node rises to a value higher than the target level,
 wherein the voltage comparison unit activates the first comparison signal when the output voltage at the output node is lower than a comparison voltage, activates the second comparison signal when the output voltage at the output node is greater than the comparison voltage, and deactivates the first and second comparison signals when the output voltage at the output node is equal to the comparison voltage.

13. The constant voltage generating apparatus of claim 12, wherein the voltage stabilizer comprises:
 a voltage comparison unit suitable for activating a first comparison signal when the output voltage at the output node drops to a value lower than the target level and activating a second comparison signal when the output voltage at the output node rises to a value higher than the target level;
 a first current generation unit turned on when the first comparison signal is activated and increasing the first current flowing from the pass node; and
 a second current generation unit turned on when the second comparison signal is activated and increasing the second current flowing from the output node.

* * * * *